United States Patent [19]

Vorreiter et al.

[11] Patent Number: 4,929,139
[45] Date of Patent: May 29, 1990

[54] PASSIVE ELECTROSTATIC VACUUM PARTICLE COLLECTOR

[75] Inventors: John W. Vorreiter, Sunnyvale; Robert L. Dean, Castro Valley, both of Calif.

[73] Assignee: The Perkin-Elmer Corporation, Norwalk, Conn.

[21] Appl. No.: 385,042

[22] Filed: Jul. 26, 1989

[51] Int. Cl.$^5$ ............................................. B65H 1/00
[52] U.S. Cl. ..................................... 414/217; 55/154; 55/385.2
[58] Field of Search ................ 414/416, 217; 118/719; 55/2, 103, 154, 155, 385.2

[56] References Cited

U.S. PATENT DOCUMENTS 3,087,500  4/1963  Jacobson ............................... 131/10
3,702,526 11/1972  Eichmeier ............................. 55/155

FOREIGN PATENT DOCUMENTS 86310  5/1986  Japan ................................... 414/217

OTHER PUBLICATIONS

Benesch/Wöhrmann, Toramalli, Sep./Oct. 1985, The Mineralogical Record, vol. 16, pp. 331–338.

Primary Examiner—Bernard Nozick
Attorney, Agent, or Firm—Thomas P. Murphy; Edwin T. Grimes

[57] ABSTRACT

Disclosed are passive electrostatic particle collectors (10 & 12) for use in vacuum chambers (24 & 32) especially for a particle beam machine system (30 & 36) to collect particulates, such as dust and debris, generated by moving parts (16) within such chambers (24 & 32). These electrostatic particle collectors (10 & 12) comprise Tourmaline crystals (12) mounted on a bracket plate (10) and strategically located where dust and debris are generated. Also disclosed is a method of removing particulate material in vacuum chambers generated by moving parts by passive electrostatic particle collectors.

11 Claims, 1 Drawing Sheet

PASSIVE ELECTROSTATIC VACUUM PARTICLE COLLECTOR

BACKGROUND OF THE INVENTION

This invention relates, in general, to the manufacture of semiconductor devices and is directed specifically to an apparatus and method of reducing or eliminating particulate matter, such as dust particles and other debris, within the vacuum chambers of particle beam lithography systems where semiconductor wafers are being transported and processed.

In the process of manufacturing semiconductor devices, such as integrated circuits, semiconductor wafers (also herein called workpieces) for making masks or reticles for integrated circuits are transported, usually on a conveyor, to a loading chamber which is pumped down to a vacuum before the wafers are transported into a vacuum processing chamber in particle beam lithography machine for processing. The conveyor also transports the processed wafers from the processing chamber and loading chamber for further manufacturing processing.

The problem with the transportation of the wafers through the loading chamber and the processing chamber is the accumulation of particulates, such as dust and debris, in certain critical areas in the vacuum chambers generated predominantly by moving parts, such as the rollers of the conveyor, the action of the hinges during the opening and closing of the chamber doors and the like. This dust and debris can become a major source of damage to the wafers and this invention is directed to the solution of this problem by providing a means and method by which such dust and debris are reduced.

Many suggestions have been made for solving this problem but they usually included other active devices which in themselves also generated dust and debris and, in general, complicated the transportation and processing of the wafers in the lithography system.

It is an object of this invention to provide a passive electrostatic particle collector usable in particle beam lithography systems for reducing dust and debris which would otherwise collect on and possibly damage to the wafers during processing.

SUMMARY OF THE INVENTION

This invention employs passive means with electrostatic properties to form electrostatic particle collectors which are vacuum compatible. More specifically, this invention utilizes natural semi-precious gemstones (Tourmaline crystals) mounted on bracket plates and placed at strategic points in vacuum chambers to collect dust particles and debris which are extremely undesirable in the lithographic process. These bracket plates are removable for periodical cleaning and replacing of the electrostatic collectors.

DETAILED DESCRIPTION

Figure 1:
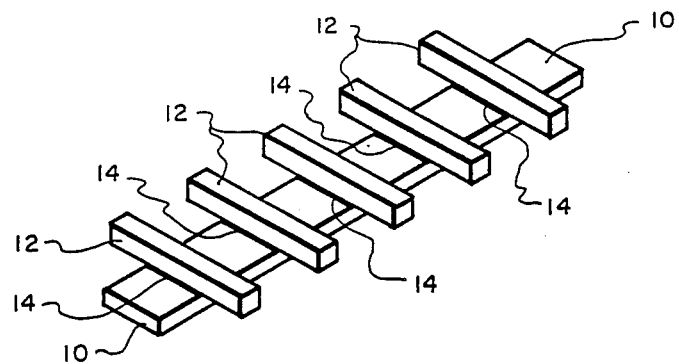
FIG. 1 is a perspective view of a mounting bracket plate with a plurality of passive electrostatic particle collectors mounted thereon.

FIG. 1 shows a mounting bracket plate 10 on which a plurality of electrostatic particle collectors (tourmaline crystals) 12 are located. These crystals 12 are attached to the bracket plate 10 in any suitable manner, such as by a vacuum compatible epoxy 14. The number and length of the crystals 12 and the length of the mounting bracket plates 10 will vary according to the needs and space of the lithography system. The bracket plate 10 itself is fastened in any suitable manner within the lithography system.

Figure 2:
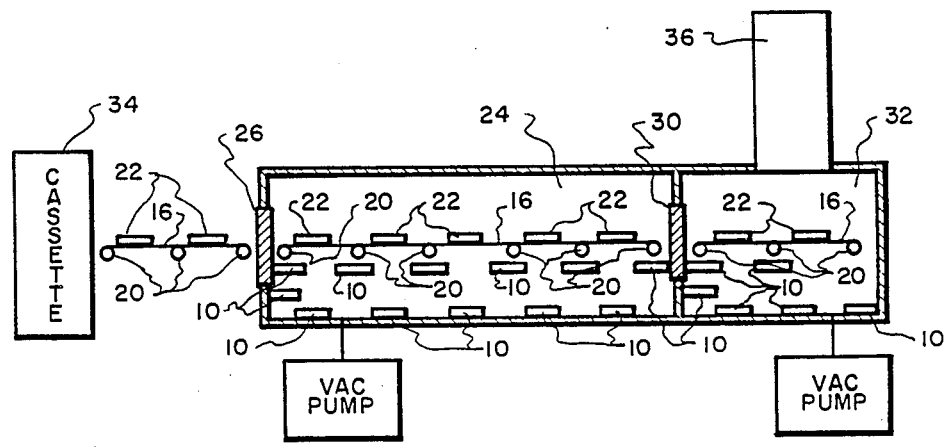
FIG. 2 is a schematic illustration of a wafer transportation system with the passive electrostatic particle collectors located selectively within the lithography system vacuum chambers.

As shown in FIG. 2 there is a powered conveyor 16 conventionally formed of a plurality of rollers 20 on which wafers 22, both unprocessed and processed, are moved through a loading chamber 24. The conveyor 16 may have a belt or have the rollers themselves provide the support for the wafers 22. The loading chamber 24 has a hinged vacuum door 26 which is periodically opened to receive a preselected number of unprocessed wafers 22 and is pumped down to a predetermined vacuum before a hinged exit vacuum door 30 is opened. This exit door 30 is also the entrance to a particle beam lithography system processing vacuum chamber 32. The unprocessed wafers 22 are conventionally loaded into a cassette, such as 34, and usually a pick-up arm (not shown) removes the unprocessed wafers 22 from the cassette 34 and places them on the conveyor 16 and returns the processed wafers 22 to the cassette after the processing step. Vacuum doors 26 and 30 are, of course, opened and closed at the appropriate time. Also, the cassette 34 and the pick-up arm may be enclosed in a first stage vacuum chamber or may be at atmosphere. If a first stage chamber is used, the particle collectors of this invention will be placed where necessary according to the teachings of this invention.

The particle beam lithography system is represented in the drawings by this vacuum chamber 32 and the particle beam column 36. The loading chamber 24 is conventionally used since it is not pumped down to the vacuum required in the processing chamber 32 but provides an interface sufficient to allow unnecessary pumping down of the processing chamber 32. While the conveyor 16 is shown in the processing chamber 32, processing chamber may have a round table on which the wafers are placed and a second pick-up arm (also not shown) may be used to transfer the wafers to and from the conveyor and to and from the round table.

As can be seen in the drawings, the conveyor 16 moves the wafers through the vacuum chambers 24 and 32 and typical of all mechanical moving parts, particulates are generated which may affect the wafers. This is particularly a problem in vacuum. As shown in FIG. 2, the mounting plate of FIG. 1 are placed preferably beneath the conveyor 16 so that any generated particulates will be drawn toward the bottom of the chambers 24 and 32 away from the tops of the wafers 22. Also, the bracket plates may be placed on the floor of the chambers 24 and 32 to further collect any particulates that have been pulled downwardly by the collectors 10 near the conveyor 16.

As can be seen from the above description, an electrostatic particle collector means has been provided, i.e., is compatible with vacuum and is passive, i.e., has no moving parts. It will be clear to those skilled in the art, familiar with vacuum chambers and recognizing the problem of undesirable particulates can place the passive collectors in any number of places as desired.

We claim:

1. In a particle beam lithography system having means for transporting processed and unprocessed wafers in vacuum chambers, a method comprising the steps of:
   mounting passive particulate collectors on a bracket plate means, and placing a plurality of such plates at strategic locations in said vacuum chambers.

2. The method as claimed in claim 1 wherein said plate means are located immediately below said transporting means.

3. The method as claimed in claim 1 wherein said plates are located on the floor of said chambers.

4. The method as claimed in claim 3 wherein said passive particulate collectors comprises Tourmaline crystal means.

5. In a vacuum system having transport means within vacuum chambers for the transportation and processing of workpieces such as semiconductor wafers, the combination of passive electrostatic particle collectors located near said transport means and at the floors of said chambers where particulate matter, dust and debris, might collect.

6. The vacuum system as claimed in claim 5 wherein said passive electrostatic particle collectors comprise Tourmaline crystals.

7. In a particle beam lithography system having a vacuum chamber in which semiconductor wafers are processed and a loading chamber through which unprocessed and processed wafers are transported, the combination of passive means for collecting particulate matter, such as dust and debris, located in each of said chambers.

8. The system as claimed in claim 7 wherein said passive collecting means comprises one or more Tourmaline crystals.

9. The system as claimed in claim 8 wherein said crystals are mounted on a bracket plate means and said bracket plate means are located near said transport means and at the lower portion of said vacuum chambers.

10. The system as claimed in claim 9 wherein said bracket plate means are located immediately beneath said transport means.

11. The system as claimed in claim 9 wherein said bracket plate means are removable for cleaning and repair of the bracket plate means and crystals.

* * * * *